(12) United States Patent
Sandner et al.

(10) Patent No.: US 7,605,664 B2
(45) Date of Patent: Oct. 20, 2009

(54) ALL DIGITAL PHASE LOCKED LOOP SYSTEM AND METHOD

(75) Inventors: Harald Sandner, Marzling (DE);
Harald Parzhuber, Eching-Haunwang (DE)

(73) Assignee: Texas Instruments Deutschland GmbH, Freising (DE)

( * ) Notice: Subject to any disclaimer, the term of this patent is extended or adjusted under 35 U.S.C. 154(b) by 27 days.

(21) Appl. No.: 11/624,149

(22) Filed: Jan. 17, 2007

(65) Prior Publication Data
US 2007/0200638 A1  Aug. 30, 2007

Related U.S. Application Data

(60) Provisional application No. 60/882,371, filed on Dec. 28, 2006.

(30) Foreign Application Priority Data
Jan. 19, 2006  (DE) .................. 10 2006 002 680

(51) Int. Cl.
*H03L 7/085* (2006.01)
(52) U.S. Cl. .................. 331/16; 331/17; 327/156
(58) Field of Classification Search ............... 331/16, 331/17; 327/156; 375/376
See application file for complete search history.

(56) References Cited

U.S. PATENT DOCUMENTS

| | | | |
|---|---|---|---|
| 5,036,294 A * | 7/1991 | McCaslin | 331/1 A |
| 5,727,038 A | 3/1998 | May et al. | |
| 6,208,211 B1 | 3/2001 | Zipper et al. | |
| 6,606,004 B2 * | 8/2003 | Staszewski et al. | 331/17 |
| 6,646,581 B1 * | 11/2003 | Huang | 341/143 |
| 6,825,785 B1 | 11/2004 | Huang et al. | |
| 2006/0284746 A1 | 12/2006 | Huang et al. | |

FOREIGN PATENT DOCUMENTS

DE   103 09 335 A1   7/2004

* cited by examiner

*Primary Examiner*—Benny Lee
*Assistant Examiner*—Levi Gannon
(74) *Attorney, Agent, or Firm*—John J. Patti; Wade J. Brady, III; Frederick J. Telecky, Jr.

(57) ABSTRACT

An all digital PLL system generates an analog oscillator signal at intermediate frequencies to achieve averaged oscillator frequencies at an extremely high frequency resolution. The PLL system includes a digitally controlled oscillator (10) with a digital control input and an analog signal output, and a feedback loop with a digital loop filter (16) for generating a digital control signal for the digitally controlled oscillator (10). The digital loop filter (16) has a first output providing an integer part ($n_{int}$) of the digital control signal and a second output providing a fractional part ($n_{\Sigma\Delta}$) of the digital control signal. A sigma-delta modulator (14) has an input connected to the second output of the digital loop filter (16) and an output providing a one-bit digital output signal ($\Sigma\Delta$), and a digital adder (12) has a first input connected to the first output of the digital loop filter (16), a second input connected to the output of the sigma-delta modulator (14), and an output connected to the digital control input of the digitally controlled oscillator (10). The output of the sigma-delta modulator (14) modulates the least significant bits from the first output of the digital loop filter (16).

16 Claims, 1 Drawing Sheet

ALL DIGITAL PHASE LOCKED LOOP SYSTEM AND METHOD

The present invention relates to an all digital phase locked loop system for generating an analog oscillator signal under control of a reference input signal.

BACKGROUND

The maximum frequency available in a system with an all digital phase locked loop (PLL) is always the frequency of the digitally controlled oscillator. The maximum available frequency in turn determines the phase difference resolution in the PLL, which is $2\pi/N$, where N is the feedback divider ratio. For phase differences smaller than $2\pi/N$, the loop is open.

SUMMARY

The all digital PLL system of the present invention is capable of generating an analog oscillator signal at intermediate frequencies to achieve averaged oscillator frequencies at an extremely high frequency resolution.

In a described embodiment, the all digital PLL system of the invention has a digitally controlled oscillator with a digital control input and an analog signal output. The feedback loop includes a digital loop filter for generating a digital control signal for the digitally controlled oscillator. The digital loop filter has a first output providing an integer part of the digital control signal and a second output providing a fractional part of the digital control signal. The PLL further includes a sigma-delta modulator with an input connected to the second output of the digital loop filter and an output providing a one-bit digital output signal. In addition, the PLL includes a digital adder with a first input connected to the first output of the digital loop filter, a second input connected to the output of the sigma-delta modulator, and an output connected to the digital control input of the digitally controlled oscillator.

The output of the sigma-delta modulator modulates the least significant bits from the first output of the digital loop filter. By modulating the least significant bits from the output of the digital loop filter and correspondingly modifying the digital control input to the digitally controlled oscillator, the oscillating frequency is affected only momentarily. Averaged over a large number of oscillator periods, the oscillator frequency will be changed by a minute amount. For example, with an oscillator controlled by an 8-bit digital word and a frequency range from 2.35 to 2.65 GHz in 256 discrete frequency steps, a frequency resolution down to about 18 Hz can be achieved with the inventive concept. The high resolution is due to the use of the sigma-delta modulator which, in a specific embodiment, has a 16-bit input from the digital loop filter, corresponding to the fractional part.

In a preferred implementation, the feedback loop further includes a feedback divider with a signal input connected to the analog signal output of the digitally controlled oscillator and a divided frequency output. The feedback loop further includes a phase frequency detector having a first input connected to the divided frequency output of the feedback divider and a second input to which the reference signal is applied. The phase frequency detector further has an output providing an up/down control signal indicative of an advanced/lagging phase relationship between the reference input signal and the analog output signal.

A phase difference determination block in the feedback loop has an input connected to the output of the phase frequency detector, and an output providing a signal indicative of the magnitude and sign of the phase difference between the reference input signal and the analog output signal. Still further, in a detailed example implementation, the feedback loop includes a digital charge pump with an input connected to the output of the phase difference determination block and a digitized current output. The digital loop filter has an input connected to the output of the digital charge pump, thereby closing the feedback loop. The magnitude of phase difference is preferably determined as the number of periods of the analog oscillator signal occurring between a rising edge of the divided oscillator signal and a rising edge of the reference signal, and the sign is determined from the phase relationship (lagging or leading) between the reference signal and the divided oscillator signal.

BRIEF DESCRIPTION OF THE DRAWINGS

Example embodiments of the invention are described with reference to accompanying drawings, wherein.

DETAILED DESCRIPTION OF EMBODIMENTS

Figure 1:
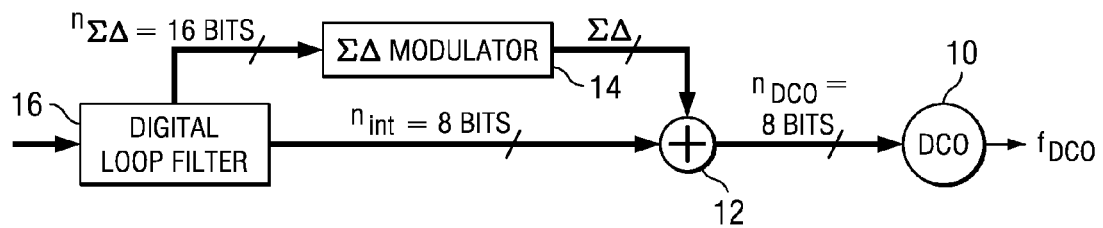
FIG. 1 is a schematic block diagram illustrating a digitally controlled oscillator with a digital adder combining the outputs of a digital loop filter and of a sigma-delta modulator to a digital control word for the oscillator.

With reference to FIG. 1, a digitally controlled oscillator (DCO) 10 has a control input that receives an 8-bit digital control signal $n_{DCO}$ and an output that supplies an analog oscillator output signal $f_{DCO}$. A digital adder 12 has an output that supplies the control signal $n_{DCO}$ and a pair of inputs, a first one of which receives a one-bit output $\Sigma\Delta$ from a sigma-delta $\Sigma\Delta$ modulator 14 and a second one of which receives an 8-bit integer output $n_{int}$ from a digital loop filter 16. The $\Sigma\Delta$ modulator 14 has an input connected to a fractional output $n_{\Sigma\Delta}$ of the digital loop filter 16. In the illustrated embodiment, the fractional input to the $\Sigma\Delta$ modulator is 16 bits wide.

In the system of FIG. 1, the integer part $n_{int}$ of the loop filter's output, being 8 bits wide in the example, determines one out of 256 discrete operating frequencies of the digitally controlled oscillator 10. In a specific example, these operating frequencies are in a range from 2.35 to 2.65 GHz. Also, in this example, the fractional output $n_{\Sigma\Delta}$ from the digital loop filter 16 is assumed to be 16 bits wide. Accordingly, on an average over many cycles, each one of the 256 discrete operating frequencies of the DCO 10 can be modulated with one out of $2^{16}$ (that is, 65.536) incremental values. As a result, and with reference to the specific example, a frequency resolution on the order of 17.8 Hz is achieved.

Figure 2:
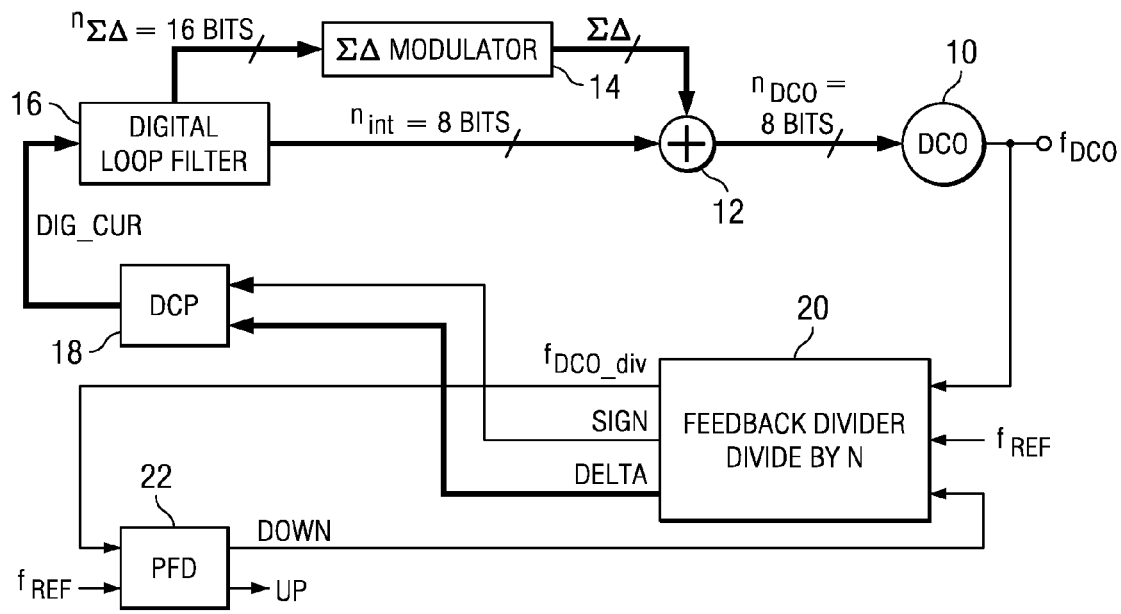
FIG. 2 is a schematic block diagram of an all digital phase locked loop incorporating the components in the block diagram of FIG. 1.

An example of a complete all digital phase locked loop system for generating an analog oscillator signal under control of a reference input signal, incorporating the system of FIG. 1, is schematically shown in FIG. 2.

In the example of FIG. 2, a digital charge pump (DCP) 18, a feedback divider (FD) 20 and a phase frequency discriminator (PFD) 22 have been added to the system of FIG. 1 to complete the all digital phase locked loop system. Specifically, DCP 18 provides a digital current output DIG_CUR to the input of digital loop filter (DLF) 16. Inputs to the DCP 18 are a SIGN signal and a DELTA signal, both coming from the feedback divider 20. Inputs to the feedback divider 20 are the output $f_{DCO}$ from DCO 10, an external reference frequency signal $f_{REF}$ and an output DN from PFD 22. The PFD 22 also receives the external reference frequency signal $f_{REF}$ as an input and a divided oscillator signal $f_{DCO\_div}$ as a further input. The signal $f_{DCO\_div}$ is, of course, provided by the feedback divider FD 20, dividing the oscillator output $f_{DCO}$ by a factor N. A second output UP of the PFD 22 may optionally go to a further input of FD 20.

The feedback divider FD 20 has two functions: A first function is to divide the oscillator output $f_{DCO}$ by a number N, resulting in the divided frequency output $f_{DCO\_div}$ supplied to an input of PFD 22. A second function of feedback divider FD 20 is to provide a measure DELTA of the phase difference between $f_{DCO\_div}$ and $f_{REF}$, and the sign SIGN of the phase difference DELTA.

Figure 3:
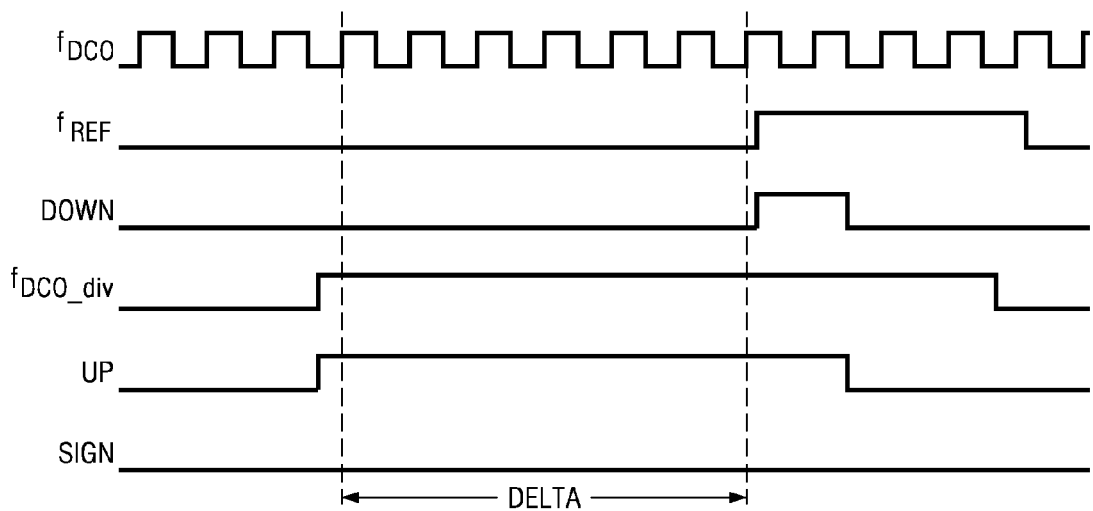
FIG. 3 is a signal diagram illustrating operation of the phase locked loop circuit.

FIG. 3 shows the form of signals associated with an example implementation. The illustrated UP signal is generated with a rising edge of the divided oscillator signal $f_{DCO\_div}$ and the illustrated DN signal is generated with the rising edge of the reference signal $f_{REF}$. If signal UP precedes signal DN, the frequency of oscillator DCO 10 must be increased; if signal DN precedes signal UP, the frequency of oscillator DCO 10 must be decreased. The phase difference DELTA is determined as the number of periods of the output $f_{DCO}$ of oscillator DCO 10 occurring between the signals UP and DN, and the signal SIGN indicates the sense in which the frequency of the oscillator must be corrected, i.e., whether it must be increased or decreased. For the illustrated case, as the signal UP contains the same relevant information as the signal $f_{DCO\_div}$, it is not necessary to apply signal UP to the feedback divider FD 20.

It should be understood that the 8-bit width used in the described example is for illustrational purposes only, and that other values could also be used according to the desired frequency resolution. Those skilled in the art to which the invention relates will appreciate that yet other additions, deletions, substitutions and modifications may be made to the described embodiments, and other embodiments implemented, without departing from the scope of the claimed invention.

What is claimed is:

1. An all digital phase locked loop system for generating an analog oscillator signal under control of a reference signal, comprising:
    a digitally controlled oscillator with a digital control input and an analog signal output;
    a digital loop filter that generates a digital control signal for the digitally controlled oscillator;
    a sigma-delta modulator with an input coupled to a second output of the digital loop filter, and an output providing a digital output signal;
    a digital adder having inputs coupled for adding an output of the digital loop filter and the output of the sigma-delta modulator, and the digital adder having an output coupled to the digital control input of the digitally controlled oscillator;
    a feedback divider that is coupled to the analog signal output signal to provide a divided oscillator signal; and
    a phase frequency detector that is coupled to the feedback divider, wherein the phase frequency detector receives the divided oscillator signal and provides an input signal to the feedback divider.

2. The system according to claim 1, wherein the feedback divider is operable to determine a phase difference and provide output signals indicative of a magnitude and sign of the phase difference between the reference signal and the divided oscillator signal.

3. The system according to claim 2, wherein the feedback divider is operable to determine the magnitude of phase difference based on the number of periods of the analog oscillator signal occurring between a rising edge of the divided oscillator signal and a rising edge of the reference signal, and is operable to determine the sign of the phase difference from the phase relationship between the reference signal and the divided oscillator signal.

4. The system according to claim 2, wherein the system further comprises a digital charge pump coupled to receive the phase difference output of the feedback divider and provide a digitized current signal as an input to the digital loop filter.

5. The system according to claim 1, wherein the phase frequency detector further comprises:
    a first input coupled for receiving the divided oscillator signal from the feedback divider;
    a second input coupled to receive the reference signal; and
    an output providing a control signal indicative of a leading/lagging phase relationship between the reference signal and the divided oscillator signal.

6. The system according to claim 1, wherein the digital loop filter comprising a first output providing an integer part of the digital control signal and a second output providing a fractional part of the digital control signal.

7. The system according to claim 1, wherein the output of the sigma-delta modulator is operable to modulate the least significant bits from a first output of the digital loop filter.

8. The system according to claim 1, wherein the output of the sigma-delta modulator further comprises a one-bit digital output signal.

9. A system for generating an analog oscillator signal under control of a reference signal, the system comprising:
    a digitally controlled oscillator with a digital control input and an analog signal output;
    a digital loop filter that generates a digital control signal for the digitally controlled oscillator;
    a sigma-delta modulator with an input coupled to a second output of the digital loop filter, and an output providing a digital output signal;
    a digital adder that is coupled to outputs from the digital loop filter and the sigma delta modulator and that is coupled to the digital control input of the digitally controlled oscillator;
    a feedback divider that is coupled to the analog signal output to provide a divided oscillator signal and a phase difference output signal; and
    a digital charge pump that is coupled to receive the phase difference output signal and that is coupled to provide a digitized current signal to the digital loop filter.

10. The system according to claim 9, wherein the output of the sigma-delta modulator is operable to modulate the least significant bits from a first output of the digital loop filter.

11. The system according to claim 9, wherein the system further comprises a phase frequency detector that is coupled to the feedback detector.

12. The system according to claim 11 wherein the phase frequency detector further comprises:
    a first input coupled for receiving the divided oscillator signal from the feedback divider;
    a second input coupled to receive a reference signal; and
    an output providing a control signal indicative of a leading/lagging phase relationship between the reference signal and the divided oscillator signal.

13. An apparatus comprising:
    a digitally controlled oscillator having a digital input terminal and an analog output terminal;

a digital loop filter that generates an integer part of a digital control signal and a fractional part of the digital control signal;

a sigma-delta modulator that is coupled to the digital loop filter so as to receive the integer part of the digital control signal;

a digital adder that is coupled to the digital loop filter so as to receive the fractional part of the digital control signal and that is coupled to the sigma delta modulator, and wherein;

a feedback divider that:

is coupled to the analog output terminal;

receives a reference signal; and generates a divided oscillator signal, a sign output signal, and a phase difference output signal;

a phase frequency detector that is coupled to the feedback divider so as to receive the divided oscillator signal and that provides a feedback signal to the feedback divider; and a digital charge pump that is coupled to the feedback divider so as to receive the sign output signal and the phase difference output signal and that is coupled to the digital input terminal.

14. The apparatus according to claim 13, wherein the integer part of the digital control signal is 8 bits.

15. The apparatus according to claim 13, wherein the fractional part of the digital control signal is 16 bits.

16. The apparatus according to claim 13, wherein the sigma-delta modulator generates a one-bit digital output signal.

* * * * *